United States Patent [19]

Copetti et al.

[11] Patent Number: 5,420,101
[45] Date of Patent: May 30, 1995

[54] STRUCTURES SUPER CONDUCTOR TRACKS AND PROCESS FOR MAKING THEM

[75] Inventors: Carlo Copetti, Jülich; Jürgen Schubert, Elsdorf-Berrendorf; Willi Zander, Aldenhoven-Neu Pattern; Christoph Buchal, Jülich, all of Germany

[73] Assignee: Forschungszentrum Julich GmbH, Julich, Germany

[21] Appl. No.: 170,350

[22] PCT Filed: Jun. 23, 1992

[86] PCT No.: PCT/DE92/00518

§ 371 Date: Dec. 23, 1993

§ 102(e) Date: Dec. 23, 1993

[87] PCT Pub. No.: WO93/00708

PCT Pub. Date: Jan. 7, 1993

[30] Foreign Application Priority Data

Jun. 24, 1991 [DE] Germany .................. 41 20 766.1
Feb. 14, 1992 [DE] Germany .................. 42 04 370.0

[51] Int. Cl.⁶ .................. H01L 23/485; H01L 39/00
[52] U.S. Cl. .................. 505/191; 505/190; 505/193; 505/329; 505/330; 505/701; 505/702; 505/729; 134/38; 427/62; 427/419.2; 427/419.3; 427/63; 257/34; 257/39
[58] Field of Search ............ 505/190, 191, 193, 329, 505/330, 701, 702, 729; 134/38; 427/62, 63, 419.2, 419.3; 257/34, 39

[56] References Cited

U.S. PATENT DOCUMENTS

| | | | |
|---|---|---|---|
| 5,096,882 | 3/1992 | Kato et al. | 505/725 |
| 5,215,960 | 6/1993 | Tanaka et al. | 505/731 |
| 5,229,360 | 7/1993 | Shiga et al. | 505/701 |
| 5,236,896 | 8/1993 | Nakamura et al. | 257/34 |
| 5,292,717 | 3/1994 | Roas | 505/728 |

*Primary Examiner*—Roy V. King
*Attorney, Agent, or Firm*—Herbert Dubno

[57] ABSTRACT

The invention relates to a structured superconductive track and a process for making it from epitaxial high temperature superconductor (HTSC) layers using lift off technique, in which a HTSC track deposited on an elevated substrate region is surrounded by an insulating layer of doped HTSC lying on a lower substrate region, and the substrate region with the superconductive track formed thereon is elevated such that the superconductive track is isolated from the insulating layer.

11 Claims, 2 Drawing Sheets

STRUCTURES SUPER CONDUCTOR TRACKS AND PROCESS FOR MAKING THEM

CROSS REFERENCE TO RELATED APPLICATIONS

This application is a national phase of PCT/DE92/00518 filed 28, Jun. 1992 as based upon German National applications P4120766.1 of 24 Jun. 1991 and P4204370.0 of 14 Feb. 1992 under the International Convention.

1. Field of the Invention

The invention relates to structured conductive tracks and to a process for producing structured conductor tracks of high temperature superconductor (HTSC) layers.

2. Background of the Invention

A focal point of development activity in the field of HTSC technology is the production of HTSC structures from thin superconductive layers ["films"]. To produce such structures two processes mainly have been developed in recent years.

In the customary process, an HTSC film is deposited by laser ablation, sputtering or the like upon a substrate which is suitable for monocrystalline growth of the HTSC. Thereafter a lacquer layer is additionally applied to the HTSC film in the regions provided for the HTSC structure, exposed and developed. The lacquer surfaces protect the coated superconductive surfaces from a subsequent etching step by means of which the HTSC film is again removed from the substrate in those regions not protected by the lacquer mask. This etching process can be effected wet chemically or by ion-beam etching. After removal of the lacquer layer, the end product of this process has a structured HTSC film running along the substrate surface.

The desired superconductive characteristics are associated with the exact chemical composition and crystallinity of the HTSC film remaining after the etching step. Nevertheless, especially in the surface regions of the HTSC structure, high electrical fields and strong surface currents can be expected. A drawback of the described process is that even the structured HTSC film is degraded by the etching step at the accessible and therefore unprotected lateral surfaces.

This is the consequence of disrupting the stoichiometry and crystallinity of the HTSC film above all in these upper surface regions so that the surface currents are intercepted by a poor partly receptive material.

As a consequence there is a reduction in the desired superconductive-properties of the HTSC tracks [traces]. In addition the lacquering also can detrimentally affect the horizontal surfaces of the superconductor.

In order to avoid such a degradation of the structured HTSC film by etching, a further process, the so-called "inhibit process" has been developed.

In the latter, initially a lacquer layer is applied to the substrate in the surface regions which are to carry the structured HTSC film. Then an inhibit doping material is vapor-deposited over the entire upper surface, whereby in the substrate surface regions intended for the HTSC tracks, the lacquer mask is separated from the substrate. In a subsequent lift-off process, the lacquer mask and the doping material simultaneously found upon the lacquer mask are lifted from the regions of the future structured HTSC films of the substrate. The HTSC film is deposited in the next step upon the now doped and undoped upper surface regions of the substrate. The deposition is effected as a rule at relatively high substrate temperatures of about 500° C. to 800° C. The HTSC material can, however, also be applied at lower temperatures; in any case one must then follow with an annealing step at the indicated higher temperatures.

The structured HTSC film then develops by monocrystalline growth upon the undoped substrate regions, while upon the doped upper surface, the HTSC material, by vertical diffusion of the doping substance, becomes an insulator.

In addition there develops apart from this desired vertical diffusion also a lateral diffusion of the doping substance into the superconductive structure because the developing monocrystalline HTSC tracks are laterally in direct contact with the doping substance. The lateral diffusion of the doping substance in the structured HTSC film has the consequence that within the conductive tracks there is a concentration gradient of the doping substance and therewith a gradual transition from "nonconducting" via "poorly conducting" to "poorly superconducting" to finally "good conducting." This resistive transition region must be avoided however for use of superconducting structures especially in microelectronics.

OBJECT OF THE INVENTION

It is therefore the object of the invention to provide a process of the kind described above initially, which enables the production of HTSC structures whose superconductive characteristics are not detrimentally effected by the fabrication process.

The object set out by the invention is achieved by a process wherein, after the application of the lacquer layer upon the substrate surface regions intended for the formation of the superconductive tracks, sufficient substrate material is deposited on the lacquer-free substrate regions that the HTSC tracks which, after the vapor deposition of the inhibit doping layer and the consequent liftoff of the lacquer mask is deposited upon the thereby liberated substrate surface regions and by epitaxial growth can be formed, insulated from the doped surface regions can carry the insulator layer and run at a relatively higher level, thereby preventing lateral modification of the superconductive tracks.

The lacquer layer applied to the substrate covers, following a photolithographic structuring, only the regions provided for the growth of HTSC material with superconductive characteristics for the purpose of filming the conductor tracks. In a subsequent process step, some substrate material and a thin inhibit layer are deposited one after the other. As a substrate material to be deposited, for example, $SrTiO_3$, $LaAlO_3$, YSZ, MgO or another appropriate substrate material can be selected. As the material for the inhibit layer to be deposited, e.g. $SiO_2$ or another suitable material can be selected. In a subsequent process step, by means of a lift-off of the lacquer mask, the substrate material and inhibit material deposited on this lacquer mask can be removed. In a subsequent process step, the deposition of the HTSC film at substrate temperatures preferably in the range between 500° C. and 800° C. is effected. In the substrate surface regions covered with the inhibit substance, the HTSC layer is degraded to an insulating layer by diffusion of the inhibit substance in the deposited HTSC layer. The growth of a superconductive epitaxial film follows, therefore, only on the free substrate surface regions. The superconductive epitaxial film is, with respect to the substrate surface region carrying the degraded insulating layer, relatively lower because of the deposition of substrate material.

The deposition of the substrate material has as a consequence that the conductive track carrying the substrate surface region is spaced in a direction perpendicular to the substrate surface from the insulating layer carrying substrate surface enough that a lateral diffusion of the inhibiting substance into the conductive track forming superconductive film is avoided.

The process of the invention has the following advantages:

In the process of the invention the formation of the HTSC tracks is effected by epitaxial growth on the substrate surface regions which are liberated following the liftoff. With the formation of the HTSC tracks, they, because of the steps taken previously, especially the poisoning of the HTSC in the higher lying substrate regions with the inhibit doping substance, have the desired structuring. By contrast with the known processes, the requisite etching of the HTSC layer to obtain the desired structure is rendered superfluous by the process of the invention. The future possibilities of contamination of an epitactically grown HTSC layer associated with such etching processes can be avoided.

During the layer deposition an automatic edge passivation HTSC layer forming the conductor tracks is achieved.

The HTSC materials are strongly anisotropic in their crystal structure. This means that the oxygen diffusion in this material is very strongly directionally dependent (diffusion parallel to the substrate surface being about a factor of 1000 times smaller than in the direction perpendicular to the substrate surface). This oxygen diffusion is a significant degradation mechanism for the HTSC material. Thus surfaces like, for example, edges which are exposed during the structuring process and are exposed in directions parallel to the substrate upper surface are little affected by this oxygen diffusion. The process of the invention gives rise, by the deposition of substrate material in the substrate surface regions provided for carrying the insulating layer, to lateral limitation of the HTSC conductive track forming film and thus to an automatic edge passivation of the bounding edges of the conductive tracks perpendicular to the substrate surfaces. A permanent protection of these edges can thus be achieved.

In an advantageous variant of the process of the invention, further degradation mechanisms, like for example, the reactions of the HTSC layer with $H_2O$ and $CO_2$ which for example can be present in the air, can be avoided in that upon the HTSC conductive tracks a further cover layer can be applied for the purpose of complete passivation of the upper surface of the HTSC layer.

A highly advantageous utilization of the high temperature superconductor in technology requires, inter alia, that the multilayer approach prevail in which HTSC layers and insulating layers alternate. In cases of possibly complete passivation in the above-mentioned sense, the process according to the invention can yield directly a three dimensional arrangement of structured HTSC conductor tracks embedded in substrate material. According to the invention, the HTSC is $YBa_2Cu_3O_{7-x}$.

The deposition of the substrate material is advantageously effected at room temperature and preferably the amorphous substrate material is deposited at room temperature. The substrate material can be deposited in the lacquer-free substrate regions at temperatures in the range of 500° C.–800° C.

The substrate material which is thus deposited can be the material of the substrate carrying the structured conductive tracks.

An especially advantageous variant of the process of the invention is then provided when as a material for the structured lacquer layer, amorphous YBaCuO is selected.

Customary materials used for forming masks in liftoff processes are suitable up to about 500° C. At higher temperatures the materials employed for the masking technique are not stable. Consequently, as a material for the substrate surface regions intended for the HTSC tracks as lacquer masks for the liftoff process, amorphous YBaCuO can be used. A lacquer mask of this material can be fabricated with the aid of conventional liftoff processes, for example at room temperature.

By the choice of amorphous YBaCuO for the lacquer layer suitable for the process according to the invention, the deposition of substrate material in the lacquer-free substrate regions can be effected at relatively high temperatures. For example it is possible to deposit $SrTiO_3$ as substrate material at 800° C. in the lacquer-free substrate regions. Under these conditions the substrate material deposits epitaxially, in a monocrystalline state upon the lacquer-free substrate upper surface. Advantageously, amorphous YBaCuO is stable at this temperature so that it can be used as a lacquer mask in the sense of the process of the present invention. The liftoff process which follows this process step can be carried out in this case with the aid of dilute hydrochloric acid (HCl).

The object of the invention can be achieved alternatively as follows: after the application of the lacquer layer upon the substrate surface regions predestined for the superconductive tracks, the lacquer-free substrate regions are sufficiently removed by etching that the lacquer layer carrying substrate regions are raised relative to the lacquer-free substrate surface regions. Since during the etching process the substrate surface regions necessary for the growth of the HTSC structures are protected by the lacquer mask, these surface regions remain undamaged. This has the consequence that substrate surface regions are formed with the highest quality for the HTSC structures which are produced by epitaxial growth in such regions subsequent to the vapor deposition of the inhibit dosing layer and the following liftoff of the lacquer mask. Since the substrate surface regions with the HTSC tracks formed thereon are raised by the deep etching to the extent that the structured tracks are isolated from the insulator carrying substrate surface regions, i.e. extend spatially separated therefrom, the high quality HTSC regions are no longer detrimentally effected by the lateral diffusion of the doping material. In addition with these process operations after the growth of the HTSC, the HTSC itself is no longer etched and is not effected by the lacquer layer. This has the consequence that the quality of the superconductor tracks remains intact. As the HTSC, preferably $YBa_2Cu_3O_{7-x}$ is used. It has been found further that an especially uniform and clean erosion of the lacquer-free substrate region results by ion beam etching.

Self-understood, however, is that also other etching methods, like for example chemical etching, can be used.

The end product of the process of the invention has structured conductive tracks of an HTSC layer applied upon a substrate and spatially separated in a direction perpendicular to the substrate surface therefrom, a relatively higher lying insulating layer of doped HTSC. The substrate of the product of the invention preferably is composed of strontium titanate ($SrTiO_3$) or lanthanum aluminate ($LaAlO_3$) since upon these substrates especially good monocrystalline growth of high quality HTSC structures can form. However as a substrate yttrium stabilized zirconium oxide (YSZ) can be suitable. The choice of the substrate material is not however limited in any way of the materials named here. Rather all substrate materials suitable for the epitaxial growth of the HTSC layers can be used. The end product of the process according to the invention has structured conductive tracks upon a substrate formed from a raised application of the HTSC layer and lower lying insulator layer of doped HTSC. Such conductive tracks are indeed known (compare D. K. Fork et al: "Reaction patterning of $YBa_2Cu_3O_{7-x}$ thin films on Si". Appl. Phys. Lett. 57(23), 1990, 2504), which differs however from the end product of the process of the invention in that with the conductive tracks structured according to the invention, the substrate is composed of a material suitable for a monocrystalline growth of the superconductive tracks and the elevation is formed from the superconductive track carrying region. By contrast, the substrate in the known raised structured track is composed of a substrate suitable as a doping substance so that the raised portions form a suitable base for the monocrystalline growth of the HTSC.

Embodiments of the process of the invention and their end products are illustrated in the drawing and are further described below.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
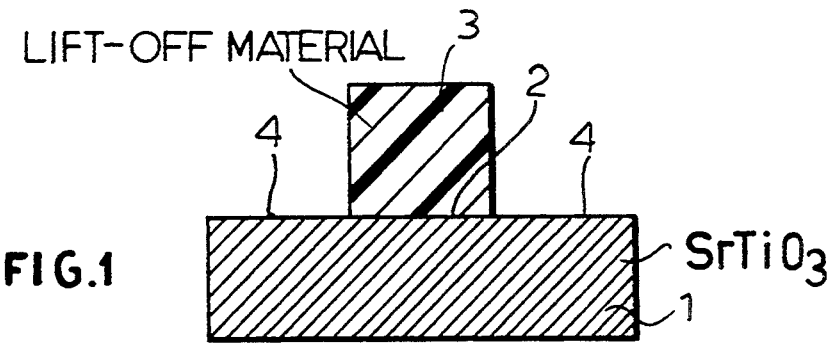
FIGS. 1–4 are cross sectional views diagrammatically illustrating successive steps in a process for carrying structured tracks according to the invention.
Figure 2:
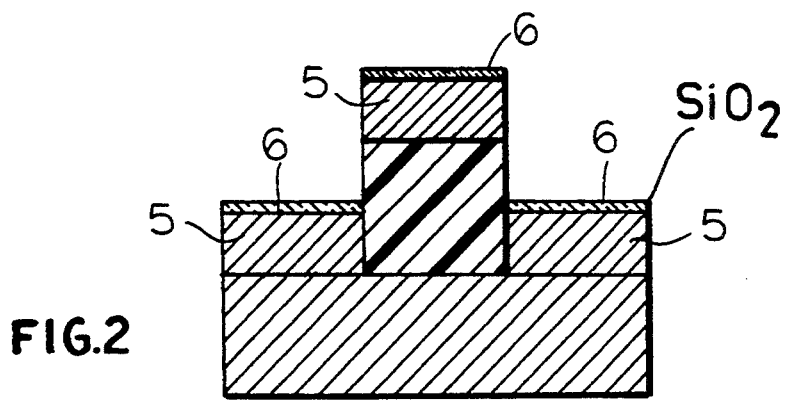

In FIGS. 1–4, the individual steps of the fabricating processes are schematically illustrated for the structured conductive tracks:

According to FIG. 1 upon a strontium titanate ($SrTiO_3$) substrate 1 suitable for the monocrystalline growth of the HTSC, in which for the superconductive tracks substrate surface regions 2 are provided, the lacquer layer 3 (photolacquer AZ1512) is applied by photolithographic structuring to form a lacquer layer over the entire surface. Upon the latter and upon the deeper lying lacquer-free substrate regions 4, substrate material 5, in sufficient quantity and then $SiO_2$ provided as an inhibiting substance 6 are deposited one after the other as illustrated in FIG. 2.

Figure 3:
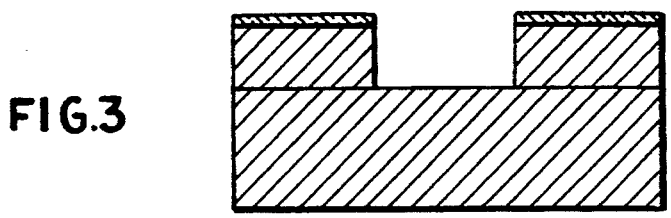
Figure 4:
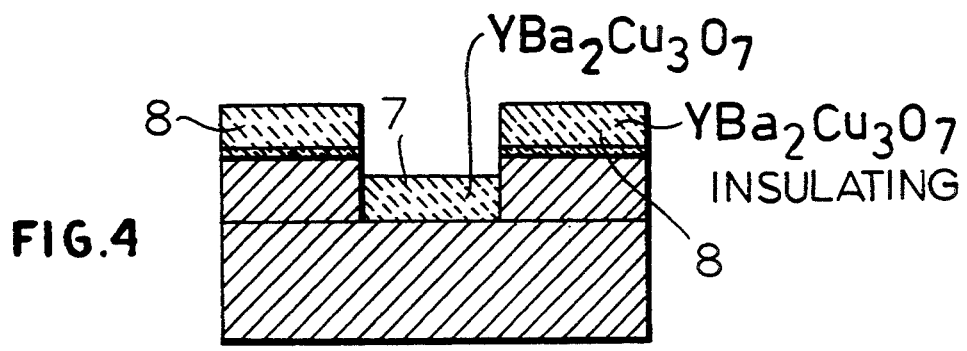

In a subsequent liftoff process, the photolacquer is lifted by means of acetone. The removal connected therewith of the structure found on the photolacquer of the deposited substrate material 5 and the inhibiting material $SiO_2$ results in a liberation of the surface regions intended for the HTSC tracks (FIG. 3).

In a subsequent process step, the epitactic growth of the HTSC layer 7 and 8 is effected. The diffusion of the inhibiting substance 6 in deposited HTSC layer region 8 results there in a poisoning of the HTSC material to a material with insulating characteristics. The epitactic growth in the substrate region 2 as a consequence of the thus resulting vertical structuring of the substrate surface yields directly the desired conductive track structure.

For the case in which the structured lacquer layer 3 is composed of amorphous YBaCuO and is produced in the range of room temperature, $SrTiO_3$ can be deposited epitactically as the substrate material in a monocrystalline form at high temperatures in the range of 800° C. Generally it is desirable or advantageous to select as the substrate material 5 to be deposited, the material of the substrate 1. It is however possible also to select different materials as substrate 1 and substrate material 5 to be deposited.

A further possibility resides in that, upon the produced HTSC conductive track 7, further material preferably one of the previously mentioned substrate materials can be deposited upon the conductive track 7 to achieve a complete track encapsulating passivation.

As a result, an HTSC conductive track buried in the substrate material can be produced. Disadvantageous ambient effects on the quality of the conductive track can thus be further suppressed.

Figure 5A:
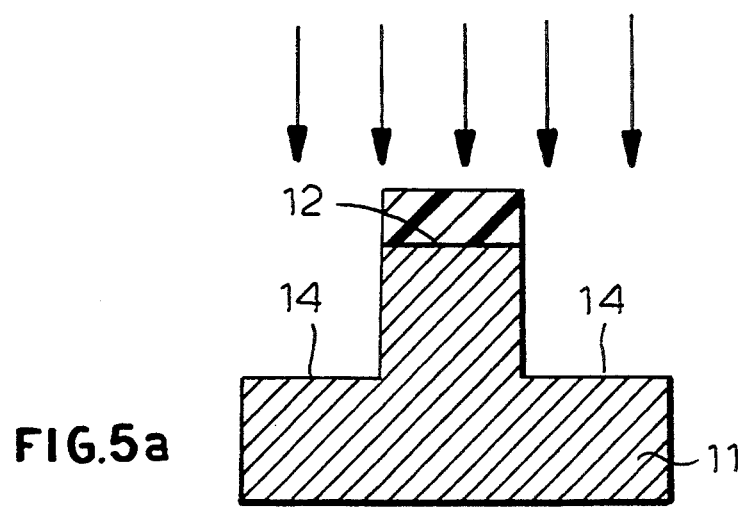
FIGS. 5a, 5b, 5c and 5d are cross sectional views diagrammatically illustrating an alternative method in successive steps.

In FIGS. 5a–d, the individual steps of the manufacturing process for the structured conductive tracks is schematically illustrated:

According to FIG. 5a, upon strontium titanate ($SrTiO_3$) as a substrate 11 suitable for the monocrystalline growth of the HTSC, in the regions 12 intended for the superconductive tracks to be provided in the substrate surface regions, the lacquer layer 13 is applied. The lower-lying lacquer-free substrate regions 14 are eroded by ion etching so that the substrate surface 12 carrying the lacquer layer 13 is raised relative to the lacquer-free substrate surfaces 14. The substrate. 11 can be, obtained from $SrTiO_3$, or other substances suitable for the epitactic growth of the HTSC, as for example, zirconium oxide ($ZrO_2$) or lanthanum aluminate ($LaAlO_3$).

Figure 5B:
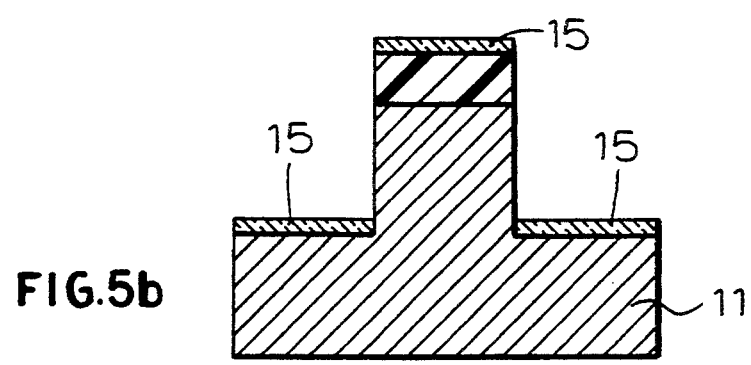
Figure 5C:
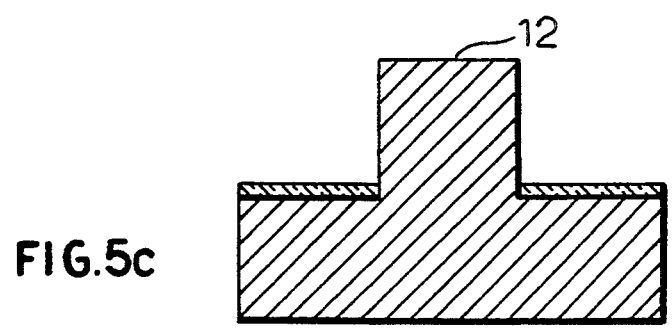

Next, referring to FIG. 5b, upon the entire surface, silicon is vapor deposited as a doping substance 15. Thereafter, the lacquer layer 13 with the doping substance 15 thereon is lifted from the substrate surface 12 so that, according to FIG. 5c, the higher lying substrate surface 12 is freed for the epitaxial growth of the HTSC, while upon the surface regions of the lower lying substrate regions 14, the silicon 15 remains.

Figure 5D:
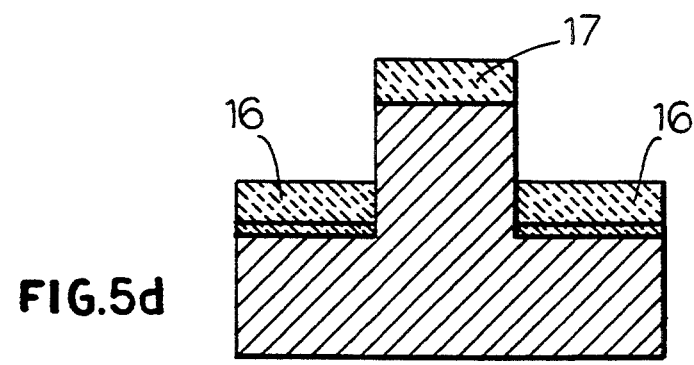

In FIG. 5d, the end product of the process of the invention after deposition of $YBa_2Cu_3O_{7-x}$ has HTSC as illustrated: While the $YBa_2Cu_3O_{7-x}$ deposited upon the lower lying substrate surfaces 14 develops as an insulator 16 by diffusion of the silicon 15 into it, the $YBa_2Cu_3O_{7-x}$ upon the elevated substrate surface 12 by epitaxial growth forms the conductive track 17.

I claim:

1. A process for the production of at least one superconductive track of a high temperature superconductor on a surface of a substrate suitable for epitaxial growth of the high temperature superconductor, said process comprising the steps of:

(a) applying to the surface of the substrate suitable for epitaxial growth of the high temperature superconductor, a lacquer layer along a region intended for forming a superconductive track;

(b) depositing upon said lacquer layer and regions of said surface adjacent said lacquer layer a sufficient thickness of a substrate material capable of sustaining growth of the high temperature superconductor to elevate the substrate material of said regions adjacent said lacquer layer above an intended level of the high temperature superconductor of the track;

(c) vapor depositing upon said lacquer layer and said substrate material of said regions adjacent said lacquer layer an inhibit doping layer of a material diffusible into the high temperature superconductor to transform the high temperature superconductor into which the material of said inhibit doping layer diffuses into an insulator;

(d) lifting off said lacquer layer with the inhibit doping layer thereon to expose said surface of said substrate along said region intended for forming said superconductive track;

(e) effecting epitaxial growth upon said substrate material and said surface of said substrate along said region intended for forming said superconductive track exposed in step (d) of said high temperature superconductor to a thickness corresponding to said intended level of said track, whereby said epitaxial growth of the high temperature superconductor is effected in said region intended for forming said superconductive track exposed in step (d) shielded from the remaining inhibit doping layer at a higher level; and (f) effecting diffusion of said material of said inhibit doping layer into the overlying high temperature superconductor to transform the high temperature superconductor on said inhibit doping layer into an insulator.

2. The process defined in claim 1 wherein the high temperature superconductor is $YBa_2Cu_3$ oxide.

3. The process defined in claim 1 wherein said substrate material is deposited at room temperature.

4. The process defined in claim 1 wherein said substrate material is deposited at a temperature in the range of 500° C. to 850° C.

5. The process defined in claim 1 wherein said substrate material is of the same composition as said substrate.

6. The process defined in claim 1 wherein said lacquer layer is amorphous YBaCuO.

7. A process for the production of at least one superconductive track of a high temperature superconductor on a surface of a substrate suitable for epitaxial growth of the high temperature superconductor, said process comprising the steps of:

(a) etching a surface of a substrate suitable for epitaxial growth of a high temperature superconductor to recess below a region intended for forming a superconductive track zones flanking said region to a depth such that inhibit doping layers on said zones will not affect a superconductive track grown on said region;

(b) applying a lacquer layer to said region;

(c) vapor depositing upon said lacquer layer and on said zones an inhibit doping layer of a material diffusible into the high temperature superconductor to transform the high temperature superconductor into which the material of said inhibit doping layer diffuses into an insulator;

(d) lifting off said lacquer layer with the inhibit doping layer thereon to expose said surface of said substrate along said region intended for forming said superconductive track;

(e) effecting epitaxial growth upon said inhibit doping layer on said zones and said surface of said substrate along said region intended for forming said superconductive track exposed in step (d) of said high temperature superconductor, whereby said epitaxial growth of the high temperature superconductor is effected in said region intended for forming said superconductive track exposed in step (d) shielded from the remaining inhibit doping layer at a lower level; and (f) effecting diffusion of said material of said inhibit doping layer into the overlying high temperature superconductor to transform the overlying high temperature superconductor on said inhibit doping layer into an insulator.

8. The process defined in claim 7 wherein the high temperature superconductor is $YBa_2Cu_3$ oxide.

9. The process defined in claim 7 wherein the etching is effected by ion-beam etching.

10. A superconductive assembly consisting essentially of a superconductive track of an epitaxial high temperature superconductor (HTSC) layer applied to an elevated substrate region and surrounded by an insulating layer of doped HTSC lying on a lower substrate region, wherein the substrate constitutes a material suitable for epitaxial growth of the superconductive track, and the substrate region with the superconductive track formed thereon is elevated such that the superconductive track is isolated from the insulating layer.

11. The assembly according to claim 10 wherein the substrate constitutes a material selected from the group consisting of strontium titanate, lanthanum aluminate and yttrium stabilized zirconium oxide.

* * * * *